United States Patent
Wang et al.

(10) Patent No.: US 6,827,800 B2
(45) Date of Patent: Dec. 7, 2004

(54) PROCESS FOR THE CONSTRAINED SINTERING OF ASYMMETRICALLY CONFIGURED DIELECTRIC LAYERS

(75) Inventors: Carl Baasun Wang, Raleigh, NC (US); Kenneth Warren Hang, Hillsborough, NC (US); Christopher Roderick Stewart Needes, Chapel Hill, NC (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/430,081

(22) Filed: May 6, 2003

(65) Prior Publication Data

US 2004/0149368 A1 Aug. 5, 2004

Related U.S. Application Data

(60) Provisional application No. 60/443,785, filed on Jan. 30, 2003.

(51) Int. Cl.[7] .............................................. B32B 31/26
(52) U.S. Cl. ................................ 156/89.11; 156/89.12; 156/89.16
(58) Field of Search ........................... 156/89.11, 89.12, 156/89.16; 428/210

(56) References Cited

U.S. PATENT DOCUMENTS

| | | | |
|---|---|---|---|
| 4,654,095 A | | 3/1987 | Steinberg |
| 5,085,720 A | | 2/1992 | Mikeska et al. |
| 5,102,720 A | * | 4/1992 | Raj .............................. 428/209 |
| 5,144,526 A | | 9/1992 | Vu et al. |
| 5,254,191 A | | 10/1993 | Mikeska et al. |
| 5,708,570 A | * | 1/1998 | Polinski, Sr. ................ 361/762 |
| 5,866,240 A | * | 2/1999 | Prabhu et al. ............... 428/210 |
| 6,139,666 A | | 10/2000 | Fasano et al. |
| 6,205,032 B1 | | 3/2001 | Shepherd |
| 6,228,196 B1 | * | 5/2001 | Sakamoto et al. ........ 156/89.17 |
| 6,258,191 B1 | * | 7/2001 | Fasano et al. ............. 156/89.12 |
| 6,337,123 B1 | * | 1/2002 | Ryugo et al. ................ 428/210 |
| 6,432,239 B1 | * | 8/2002 | Mandai et al. ............ 156/89.12 |
| 6,582,541 B2 | * | 6/2003 | Nishide et al. ........... 156/89.12 |
| 2002/0189742 A1 | * | 12/2002 | Moriya et al. ............ 156/89.11 |
| 2003/0113554 A1 | * | 6/2003 | Umayahara et al. ......... 428/446 |

FOREIGN PATENT DOCUMENTS

WO 00/04577 * 1/2000

* cited by examiner

Primary Examiner—Melvin C. Mayes

(57) ABSTRACT

A method to produce a distortion-free asymmetrical low-temperature co-fired ceramic structure comprising at least one layer of glass-containing internal constraining tape and at least one layer of glass-containing primary tape wherein the internal constraining tape and the primary tape are laminated to form an asymmetrical laminate and wherein a release layer is deposited on at least one surface of the laminate forming an assembly, wherein the surface is opposite the position of greatest asymmetry of the laminated layers and wherein the assembly is thermally processed producing a structure exhibiting an interactive suppression of x,y shrinkage.

11 Claims, 1 Drawing Sheet

PROCESS FOR THE CONSTRAINED SINTERING OF ASYMMETRICALLY CONFIGURED DIELECTRIC LAYERS

FIELD OF THE INVENTION

This invention relates to a process which produces flat, distortion-free, zero-shrink, low-temperature co-fired ceramic (LTCC) bodies, composites, modules or packages from precursor green (unfired) laminates of different dielectric tape chemistries that are configured in an asymmetrical arrangement in the z-axis of the laminate.

BACKGROUND OF THE INVENTION

An interconnect circuit board or package is the physical realization of electronic circuits or subsystems from a number of extremely small circuit elements electrically and mechanically interconnected. It is frequently desirable to combine these diverse type electronic components in an arrangement so that they can be physically isolated and mounted adjacent to one another in a single compact package and electrically connected to each other and/or to common connections extending from the package.

Complex electronic circuits generally require that the circuit be constructed of several levels of conductors separated by corresponding insulating dielectric tape layers. The conductor layers are interconnected through the dielectric layers that separate them by electrically conductive pathways, called via fills.

The use of a ceramic-based green tape to make low temperature co-fired ceramic (LTCC) multilayer circuits was disclosed in U.S. Pat. No. 4,654,095 to Steinberg. The co-fired, free sintering process offered many advantages over previous technologies. However, when larger circuits were needed, the firing shrinkage proved too broad to meet the needs. Given the reduced sizes of the current generation of surface mount components, the shrinkage tolerance (reproducibility of shrinkage) has proved too great to permit the useful manufacture of LTCC laminates much larger than 6" by 6". This upper limit continues to be challenged today by the need for greater circuit density as each generation of new circuits and packages evolves. In turn this translates into ever-smaller component sizes and thereby into smaller geometry's including narrower conductor lines and spaces and smaller vias on finer pitches in the tape. All of this requires a much lower shrinkage tolerance than could be provided practically by the free sintering of LTCC laminates.

A method for reducing X-Y shrinkage during firing of green ceramic bodies in which a release layer, which becomes porous during firing, is placed upon the ceramic body and the assemblage is fired while maintaining pressure on the assemblage normal to the body surface was disclosed in U.S. Pat. No. 5,085,720 to Mikeska. This method used to make LTCC multilayer circuits provided a significant advantage over Steinberg, as a reduction X-Y shrinkage was obtained through the pressure assisted method.

An improved co-fired LTCC process was developed and is disclosed in U.S. Pat. No. 5,254,191 to Mikeska. This process, referred to as PLAS, an acronym for pressure-less assisted sintering, placed a ceramic-based release tape layer on the two major external surfaces of a green LTCC laminate. The release tape controls shrinkage during the firing process. Since it allows the fired dimension of circuit features to be more predictable, the process represents a great improvement in the fired shrinkage tolerance. During the release tape-based constrained sintering process, the release tape acts to pin and restrain any possible shrinkage in x- and y-directions. The release tape itself does not sinter to any appreciable degree and is removed prior to any subsequent circuit manufacturing operation.

In a more recent invention, U.S. Patent Application 60/385,697, the teachings of constrained sintering are extended to include the use of a non-fugitive, non-removable, non-sacrificial or non-release, internal self-constraining tape. The fired laminate comprises layers of a primary dielectric tape which define the bulk properties of the final ceramic body and one or more layers of a secondary or self-constraining tape. The sole purpose of the latter is to constrain the sintering of the primary tape so that the net shrinkage in the x, y direction is zero. This process is referred to as a self-constraining process and the acronym SCPLAS is applied. The shrinkage tolerances achieved by this process are very similar to those achieved by the release-tape based constrained sintering process. The self-constraining tape is placed in strategic locations within the structure and remains part of the structure after co-firing is completed. There is no restriction on the placement of the self-constraining tape other than that z-axis symmetry is preserved.

Therefore, symmetrical-only arrangements were available to the circuit designer which has proved to be a significant limitation to the capabilities of LTCC technology. It restricts the designer's freedom to provide the optimal circuit configuration both from the viewpoint of performance, cost and form factor. The current invention with its asymmetical arrangement removes this limitation. It allows the circuit designer a greater flexibility to use the optimal number of tape layers, the most compatible companion conductor, resistor and dielectric materials in achieving the highest-quality circuit function.

DETAILED DESCRIPTION OF THE INVENTION

Figure 1:
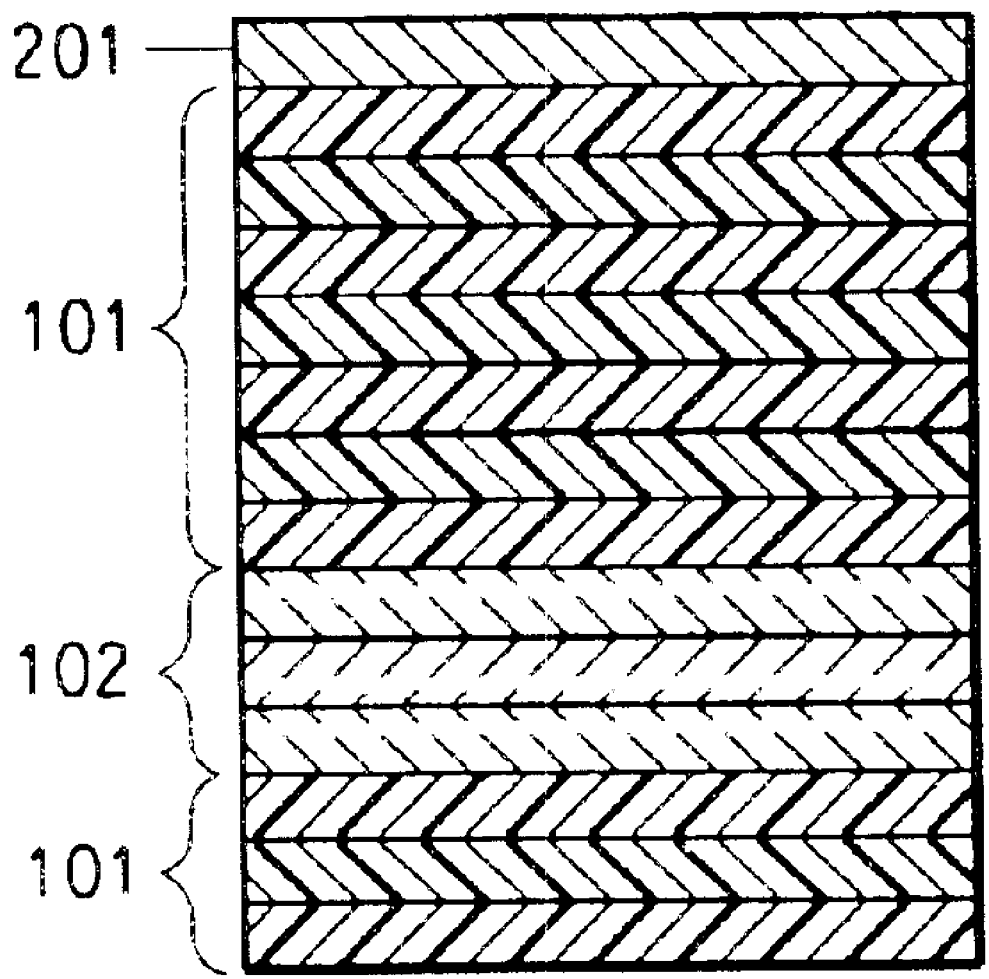
FIG. 1 is an illustration of asymmetrical structures of the present invention.

The current invention extends the teachings of constrained sintering to the production of large area camber-free, co-fired LTCC structures that are derived from asymmetric arrangements of low dielectric constant tape, and high k dielectric constant tape materials, each of a different chemistry. It combines the use both of internal, permanent, self-constraining tape and external, removable release constraining tape.

Asymmetric structures cannot be co-fired flat by conventional processing techniques. They tend to bow or camber in a concave manner, i.e., the two edges of the laminate will be significantly higher than the center-point in the direction perpendicular to the plane of maximum asymmetry.

In a preferred embodiment of this invention, as shown in FIG. 1, an internal constraining layer (102) is formulated to provide a self-constraining function and an embedded capacitor function within a LTCC assembly.

The properties of the processed internal constraining layer provide a rigid physical form restraining x and y shrinkage of primary tapes (101) and impart functional properties to the final LTCC assembly. The internal constraining tape precedes the sintering of the primary tape layers. To prevent bowing and permanent structural distortion after co-firing because of the difference in dielectric chemistries without the need to symmetrically balance it with dummy or compensating layers, a layer of removable, non permanent release layer (201) is applied to the outside surface directly opposite the source of greatest asymmetry. This enables extremely asymmetric structures to be fired flat. After firing, the release layer is removed using conventional brushing or sand blasting methods.

A conventional LTCC primary tape (101) typically processes at temperatures near 850° C. When a conventional release layer (201) is used, it must not sinter or become part of the final LTCC body to function properly. Contrary to that, an internal constraining tape (102) as utilized in the present invention contains glasses that flow, densify, and become rigid at temperatures significantly below 850° C., which is a standard process temperature.

The internal constraining tape becomes part of the final LTCC body. This significantly increases the performance requirements for the internal constraining tape material. The electrical properties (i.e., dielectric constant) of the internal constraining tape may also be adjusted with a choice of materials that make up the tape. This makes possible the use of more than one chemical type of primary tape to locally control the dielectric and other electrical properties of a portion of a LTCC circuit.

The primary tape (101) is generally the majority tape in a LTCC assembly and the resultant fired assembly derives its mechanical and electrical characteristics from it. In most situations the internal constraining tape has a minority presence in the structure. It can be used effectively to locally modify aspects of the dielectric and other electrical performance of the assembly, but its biggest influence is to control the physical structure by constraining its x,y shrinkage substantially to zero.

During the heating of the assembly of the present invention, the glass in the internal constraining tape (high k, with a typical range of 10–5000) attains its transition temperature (the temperature at which the glass softens and flows) earlier than the glass of the primary tape (low k, with a typical range of 6 to 10) and it flows sufficiently to coat the surface particles of the adjacent layers of the primary tape. Since the crystallization temperature of the internal constraining tape glass is close to its transition temperature, crystallization occurs very soon after. This has the result of stiffening the glass and significantly raising its composite viscosity or elevating its re-melting temperature beyond the peak firing temperature of 825 to 875° C. of the first co-firing and/or subsequent post-firing process.

Although crystallization is a preferred method to rigidify tape after the densification and flow period of a glass filled tape, phase immiscibility using glass or glass-filler mixtures to effectively rigidify the tape is also a possible method. This process from sintering onset to rigidification can be measured for glass and filler combinations by the use of TMA, Thermo-mechanical analysis. For example, preferably the glass in the primary tape exhibits an onset of dimensional change as measured in TMA of about 700° C. or higher. Preferably the glass in the constraining tape exhibits an onset of dimensional change as measured in TMA of about 75° C. or more preferably 100 to 150° C. lower than the primary tape.

The constraining influence of the primary tape ensures that x,y shrinkage in the internal constraining tape is very small, if not zero. Subsequent increases in temperature cause the internal constraining tape to sinter fully and its glass to complete its crystallization. Since a suitable glass will, typically, develop in excess of 50 volume % crystalline phases, the internal constraining tape body becomes rigid when dominated by the volumetric accumulation of crystalline content of filler and in situ formation of crystal from the glass. Then, when the transition temperature of the primary tape glass is achieved and flow occurs, it is kept physically in place by its previous interaction with the internal constraining tape. Thus, the already-sintered internal constraining tape layers become the constraining force and the primary tape is constrained while sintering to shrink only in the z-direction. Once the assembly is fully sintered and has cooled down, the assembly will be seen to possess the same dimensions in the x,y direction as the original "green" or unfired assembly. The layers of the now chemically reacted inorganic components of the two or more individual tapes used in the assembly are interleaved in various configurations. The only still observable boundaries being those where tapes of different chemistries were placed adjacent to each other.

Such an innovation offers the advantages of facilitating cofireable conductors on the surface opposite the side with the release tape and also relieves the practical restrictions that externally-constrained sintered structures experience as the layer count is increased and the constraining influence of the external release tape is felt less and less. In addition, the use of the internal constraining tape allows the formation of exactly dimensioned, non-shrink cavities in a tape structure. Both blind and through cavities can be produced by this constrained sintering technique.

In order to meet the performance requirements of LTCC circuit manufacturers, additional material performance factors must be considered beyond the simple process of constraining the x,y shrinkage in the green tape assembly when thermally processed. The coefficient of thermal expansion of both the internal constraining tape and the primary tape must be sufficiently close in magnitude to provide for the production of 6"×6" or larger ceramic boards consisting of many layers of laminated green tape materials. Inattention to this could result in stress induced cracking in the fired ceramic LTCC body during the temperature descending portion of the furnace firing or thereafter.

Another design factor is created because the internal constraining tape must be thermally processed to a rigid body prior to the primary tape to provide proper system x,y constraint. This means that the glass-filler material in the internal constraining tape should be designed to attain a lower composite viscosity to the primary tape, but at approximately 50–150° C. lower in temperature and preferably in the range of 80–150° C. It should be noted that the above assessment was based on a belt furnace firing profile at an ascending rate of 6–8° C. per minute between 450° C. and 800° C. Such a profile is commonly used to achieve high throughput in mass production of LTCC circuit substrates. However, a smaller temperature difference (e.g. <50° C.) can also be effective if the firing profile in a multiple zone belt or box furnace provides a plateau to facilitate the full densification, and/or crystallization, and rigidification of the internal constraining tape. It should also provide sufficient compatibility between internal constraining and primary tapes during the densification to maintain the strength and bonding at the respective tape interfaces. This compatibility can be influenced by tape formulation, physical characteristics of the constituents and changes in thermal processing conditions. The electrical properties of the internal constraining tape material must also meet performance requirements for high frequency circuit applications.

The release layer for use in the method of the invention is comprised of non-metallic particles dispersed in a solid organic polymer binder. As mentioned above, it is preferred that the non-metallic particles in the release layer have a lower sintering rate than the inorganic binder of the primary tape layer being fired at conventional temperatures with a preferred being 850° C. and that the wetting angle of the inorganic binder on the primary tape layer and the viscosity of the inorganic binder be such that glass penetration into the release layer is during subsequent firing is no more than 50 $\mu$m. Thus, the composition of the inorganic solids component of the release layer is likewise not critical as long as it does not undergo sintering during firing and as long as the wetting angle and the viscosity of the inorganic binder in the primary tape layer being fired are within the preferred bounds which prohibit substantial penetration into the release layer. Although the inorganic non-metallic solids used in the release layer may be the same as those used in the primary tape, mullite, quartz, $Al_2O_3$, $CeO_2$, $SnO_2$, MgO, $ZrO_2$, BN and mixtures thereof are preferred. Furthermore, glassy materials can be used provided their softening points are sufficiently high so that they do not undergo sintering when they are fired in accordance with the invention.

The release layer can be applied in the form of a flexible tape, a thick film paste, spray, dip, roll, etc. Regardless of the form in which the layer is applied, it is essential that the layer be flexible in order to attain close conformance to the surface of the LTCC assembly to reduce and preferably minimize the size of any gaps (flaws) at the release layer/primary tape interface and increase the critical stress value at the interface. In general, the same binder polymers which are suitable for the unfired internal constraining and primary tape layers will be suitable for the release layer when it is applied as a tape.

As used herein, the terms "thick film" and "thick film paste" refer to dispersions of finely divided solids in an organic medium, which are of paste consistency and have a rheology suitable for screen printing and spray, dip or roll-coating. The organic media for such pastes are ordinarily comprised of liquid binder polymer and various rheological agents dissolved in a solvent, all of which are completely pyrolyzable during the firing process. Such pastes can be either resistive or conductive and, in some instances, may even be dielectric in nature. Such compositions may or may not contain an inorganic binder, depending upon whether or not the functional solids are required to be sintered during firing. Conventional organic media of the type used in thick film pastes are also suitable for the internal constraining layer. A more detailed discussion of suitable organic media materials can be found in U.S. Pat. No. 4,536,535 to Usala.

To ensure the formation of interconnected porosity in the release layer in order to provide an escape pathway for polymer decomposition products, the pore escape channels (void or pore structure) between the individual particles within the release layer must be sufficient in size and remain open during heatup. For the pore channels to remain open during heatup, the sintering rate of the release layer material must be less than the sintering rate of the primary tape layer being fired as previously discussed. The pore structure in the release layer is determined by the characteristic particle arrangement or assembly within the layer. The arrangement or packing of particles in the layer is influenced by several factors including: the volume fraction of solids, the solids particle size, size distribution, and shape, the degree of dispersion of the particles in the initial casting, the drying characteristics of the casting, whether the layer is applied by dip or spray slurrying, and how the layer is applied. Furthermore, the pore or void structure in a tape, spray, or dip layer that contains a polymer matrix will most likely be different in the layer after the polymer is pyrolyzed. Keeping the foregoing conditions in mind, it is possible to pack particles to a bulk density of ~90 vol % solids. On the other hand, a lower limit on bulk density of ~10 vol % solids should be practicable to provide sufficiently large pore channels without serious degradation of the x,y compressive stress capability of the layer and without significant penetration of the glass into the layer. A more detailed discussion of a suitable release layer can be found in U.S. Pat. No. 5,254,191, which is incorporated herein by reference.

Internal constraining and primary tape components and formulations follow. The internal constraining tape (102) is further characterized as composed of a filler ceramic material such as $Al_2O_3$, $ZrO_2$, $ZrSiO_4$, etc., with a crystallizable or filler reactable glass composition so that its flow, densification and rigidification during firing proceed the remaining layers of primary tape. Although a constraining or primary tape normally may consist of a glass and filler, it may be designed by skilled artisans to utilize more than one glass or more than one filler. The physical act of restricting the x,y shrinkage of the internal constraining tape by the primary tape during thermal processing is quite similar to the externally applied release layers of a conventional primary tape assembly. It is to be noted, however, that although the terms of "primary tape" and "internal constraining tape" are used in this invention, the "primary tape" constrains the "internal constraining tape" during its lower temperature sintering/crystallization process; whereas the already sintered "internal constraining tape" constrains the "primary tape" during its higher temperature firing. The requirements for suitable materials to serve as a non-sacrificed internal constraining tape are however different. The material requirements are considered below.

Specific examples of glasses that may be used in the primary or internal constraining tape are listed in Table 1. Preferred glass compositions found in the internal constraining tape comprise the following oxide constituents in the compositional range of: $B_2O_3$ 6–13, BaO 20–22, $Li_2O$ 0.5–1.5, $P_2O_5$ 3.5–4.5, $TiO_2$ 25–33, $Cs_2O$ 1–6.5, $Nd_2O_3$ 29–32 in weight %. The more preferred composition of glass being: $B_2O_3$ 11.84, BaO 21.12, $Li_2O$ 1.31, $P_2O_5$ 4.14, $TiO_2$ 25.44, $Cs_2O$ 6.16, $Nd_2O_3$ 29.99 in weight %. Another preferred glass comprises the following oxide constituents in the compositional range of: $SiO_2$ 12–14, $ZrO_2$ 3–6, $B_2O_3$ 20–27, BaO 12–15, MgO 33–36, $Li_2O$ 1–3, $P_2O_5$ 3–8, $Cs_2O$ 0–2 in weight %. The preferred composition of glass being: $SiO_2$ 13.77, $ZrO_2$ 4.70, $B_2O_3$ 26.10, BaO 14.05, MgO 35.09, $Li_2O$ 1.95, $P_2O_5$ 4.34 in weight %.

Preferred glasses for use in the primary tape comprise the following oxide constituents in the compositional range of: $SiO_2$ 52–54, $Al_2O_3$ 12.5–14.5, $B_2O_3$ 8–9, CaO 16–18, MgO 0.5–5, $Na_2O$ 1.7–2.5, $Li_2O$ 0.2–0.3, SrO 0–4, $K_2O$ 1–2 in weight %. The more preferred composition of glass being: $SiO_2$ 53.50, $Al_2O_3$ 13.00, $B_2O_3$ 8.50, CaO 17.0, MgO 1.00 $Na_2O$ 2.25, $Li_2O$ 0.25, SrO 3.00, $K_2O$ 1.50 in weight %.

In the primary or constraining tape the $D_{50}$ (median particle size) of frit is preferably in the range of, but not limited to, 0.1 to 5.0 mils and more preferably 0.3 to 3.0 mils.

The glasses described herein are produced by conventional glass making techniques. The glasses were prepared in 500–1000 gram quantities. Typically, the ingredients are weighed then mixed in the desired proportions and heated in a bottom-loading furnace to form a melt in platinum alloy crucibles. As well known in the art, heating is conducted to a peak temperature (1450–1600° C.) and for a time such that the melt becomes entirely liquid and homogeneous. The glass melts were then quenched by counter rotating stainless steel roller to form a 10–20 mil thick platelet of glass. The resulting glass platelet was then milled to form a powder with its 50% volume distribution set between 1–5 microns. The glass powders were then formulated with filler and organic medium to cast tapes as detailed in the Examples section. The glass compositions shown in Table 1 represent a broad variety of glass chemistry (high amounts of glass former to low amounts of glass former). The glass former oxides are typically small size ions with high chemical coordination numbers such as $SiO_2$, $B_2O_3$, and $P_2O_5$. The remaining oxides represented in the table are considered glass modifiers and intermediates.

densified and is too porous. Within the desirable glass/filler ratio, it will be apparent that, during firing, the liquid glass phase will become saturated with filler material.

For the purpose of obtaining higher densification of the composition upon firing, it is important that the inorganic solids have small particle sizes. In particular, substantially all of the particles should not exceed 15 $\mu$m and preferably not exceed 10 $\mu$m. Subject to these maximum size limitations, it is preferred that at least 50% of the particles, both glass and ceramic filler, be greater than 1 $\mu$m and less than 6 $\mu$m.

The organic medium in which the glass and ceramic inorganic solids are dispersed is comprised of a polymeric binder which is dissolved in a volatile organic solvent and, optionally, other dissolved materials such as plasticizers,

TABLE 1

(wt. %)

| Glass # | $SiO_2$ | $Al_2O_3$ | PbO | $ZrO_2$ | $B_2O_3$ | CaO | BaO | MgO | $Na_2O$ | $Li_2O$ | $P_2O_5$ | $TiO_2$ | $K_2O$ | $Cs_2O$ | $Nd_2O_3$ | SrO |
|---|---|---|---|---|---|---|---|---|---|---|---|---|---|---|---|---|
| 1 | | | | | 6.08 | 23.12 | | | | | 4.50 | 34.25 | | | 32.05 | |
| 2 | 13.77 | | | 4.70 | 26.10 | | 14.05 | 35.09 | | 1.95 | 4.34 | | | | | |
| 3 | 55.00 | 14.00 | | | 9.00 | 17.50 | | 4.50 | | | | | | | | |
| 4 | | | | | 11.91 | | 21.24 | | | 0.97 | 4.16 | 26.95 | | 4.59 | 30.16 | |
| 5 | 56.50 | 9.10 | 17.20 | | 4.50 | 8.00 | | 0.60 | 2.40 | | | | 1.70 | | | |
| 6 | | | | | 11.84 | | 21.12 | | | 1.31 | 4.14 | 25.44 | | 6.16 | 29.99 | |
| 7 | 52.00 | 14.00 | | | 8.50 | 17.50 | | 4.75 | 2.00 | 0.25 | | | 1.00 | | | |
| 8 | | | | | 6.27 | | 22.79 | | | 0.93 | 4.64 | 33.76 | | | 31.60 | |
| 9 | | | | | 9.55 | | 21.73 | | | 0.92 | 4.23 | 32.20 | | 1.24 | 30.13 | |
| 10 | | | | | 10.19 | | 21.19 | | | 0.97 | 4.15 | 28.83 | | 4.58 | 30.08 | |
| 11 | 13.67 | | | 5.03 | 25.92 | | | 13.95 | 34.85 | 1.94 | 4.64 | | | | | |
| 12 | 12.83 | | | 4.65 | 21.72 | | | 13.09 | 34.09 | 1.96 | 11.65 | | | | | |
| 13 | 13.80 | | | 4.99 | 25.86 | | | 13.45 | 33.60 | 2.09 | 4.35 | | | 1.87 | | |
| 14 | 52.00 | 14.00 | | | 9.00 | 17.50 | | 5.00 | 1.75 | 0.25 | | | 0.50 | | | |
| 15 | 53.5 | 13.00 | | | 8.50 | 17.00 | | 1.00 | 2.25 | 0.25 | | | 1.50 | | | 3.00 |
| 16 | 13.77 | | | 4.70 | 22.60 | | 14.05 | 35.09 | | 1.95 | 7.84 | | | | | |
| 17 | 54.00 | 12.86 | | | 8.41 | 16.82 | | 0.99 | 2.23 | 0.25 | | | 1.48 | | | 2.96 |

Ceramic filler such as $Al_2O_3$, $ZrO_2$, $TiO_2$, $BaTiO_3$ or mixtures thereof may be added to the castable composition used to form the tapes in an amount of 0–50 wt. % based on solids. Depending on the type of filler, different crystalline phases are expected to form after firing. The filler can control dielectric constant and loss over the frequency range. For example, the addition of $BaTiO_3$ can increase the dielectric constant significantly.

$Al_2O_3$ is the preferred ceramic filler since it reacts with the glass to form an Al-containing crystalline phase. $Al_2O_3$ is very effective in providing high mechanical strength and inertness against detrimental chemical reactions. Another function of the ceramic filler is rheological control of the entire system during firing. The ceramic particles limit flow of the glass by acting as a physical barrier. They also inhibit sintering of the glass and thus facilitate better burnout of the organics. Other fillers, $\alpha$-quartz, $CaZrO_3$, mullite, cordierite, forsterite, zircon, zirconia, $BaTiO_3$, $CaTiO_3$, $MgTiO_3$, $SiO_2$, amorphous silica or mixtures thereof may be used to modify tape performance and characteristics. It is preferred that the filler has at least a bimodal particle size distribution with D50 of the larger size filler in the range of. 1.5 and 2 microns and the D50 of the smaller size filler in the range of 0.3 and 0.8 microns.

In the formulation of internal constraining and primary tape compositions, the amount of glass relative to the amount of ceramic material is important. A filler range of 20–40% by weight is considered desirable in that the sufficient densification is achieved. If the filler concentration exceeds 50% by wt., the fired structure is not sufficiently release agents, dispersing agents, stripping agents, antifoaming agents, stabilizing agents and wetting agents.

To obtain better binding efficiency, it is preferred to use at least 5% wt. polymer binder for 90% wt. solids, which includes glass and ceramic filler, based on total composition. However, it is more preferred to use no more than 30% wt. polymer binder and other low volatility modifiers such as plasticizer and a minimum of 70% inorganic solids. Within these limits, it is desirable to use the least possible amount of binder and other low volatility organic modifiers, in order to reduce the amount of organics which must be removed by pyrolysis, and to obtain better particle packing which facilitates full densification upon firing.

In the past, various polymeric materials have been employed as the binder for green tapes, e.g., poly(vinyl butyral), poly(vinyl acetate), poly(vinyl alcohol), cellulosic polymers such as methyl cellulose, ethyl cellulose, hydroxyethyl cellulose, methylhydroxyethyl cellulose, atactic polypropylene, polyethylene, silicon polymers such as poly (methyl siloxane), poly(methylphenyl siloxane), polystyrene, butadiene/styrene copolymer, polystyrene, poly (vinyl pyrollidone), polyamides, high molecular weight polyethers, copolymers of ethylene oxide and propylene oxide, polyacrylamides, and various acrylic polymers such as sodium polyacrylate, poly(lower alkyl acrylates), poly (lower alkyl methacrylates) and various copolymers and multipolymers of lower alkyl acrylates and methacrylates. Copolymers of ethyl methacrylate and methyl acrylate and terpolymers of ethyl acrylate, methyl methacrylate and methacrylic acid have been previously used as binders for slip casting materials.

U.S. Pat. No. 4,536,535 to Usala, issued Aug. 20, 1985, has disclosed an organic binder which is a mixture of compatible multipolymers of 0–100% wt. $C_{1-8}$ alkyl methacrylate, 100–0% wt. $C_{1-8}$ alkyl acrylate and 0–5% wt. ethylenically unsaturated carboxylic acid of amine. Because the above polymers can be used in minimum quantity with a maximum quantity of dielectric solids, they are preferably selected to produce the dielectric compositions of this invention. For this reason, the disclosure of the above-referred Usala application is incorporated by reference herein.

Frequently, the polymeric binder will also contain a small amount, relative to the binder polymer, of a plasticizer that serves to lower the glass transition temperature (Tg) of the binder polymer. The choice of plasticizers, of course, is determined primarily by the polymer that needs to be modified. Among the plasticizers which have been used in various binder systems are diethyl phthalate, dibutyl phthalate, dioctyl phthalate, butyl benzyl phthalate, alkyl phosphates, polyalkylene glycols, glycerol, poly(ethylene oxides), hydroxyethylated alkyl phenol, dialkyldithiophosphonate and poly(isobutylene). Of these, butyl benzyl phthalate is most frequently used in acrylic polymer systems because it can be used effectively in relatively small concentrations.

The solvent component of the casting solution is chosen so as to obtain complete dissolution of the polymer and sufficiently high volatility to enable the solvent to be evaporated from the dispersion by the application of relatively low levels of heat at atmospheric pressure. In addition, the solvent must boil well below the boiling point or the decomposition temperature of any other additives contained in the organic medium. Thus, solvents having atmospheric boiling points below 150° C. are used most frequently. Such solvents include acetone, xylene, methanol, ethanol, isopropanol, methyl ethyl ketone, ethyl acetate, 1,1,1-trichloroethane, tetrachloroethylene, amyl acetate, 2,2,4-triethyl pentanediol-1,3-monoisobutyrate, toluene, methylene chloride and fluorocarbons. Individual solvents mentioned above may not completely dissolve the binder polymers. Yet, when blended with other solvent(s), they function satisfactorily. This is well within the skill of those in the art. A particularly preferred solvent is ethyl acetate since it avoids the use of environmentally hazardous chlorocarbons.

In addition to the solvent and polymer, a plasticizer is used to prevent tape cracking and provide wider latitude of as-coated tape handling ability such as blanking, printing, and lamination. A preferred plasticizer is BENZOFLEX® 400 manufactured by Rohm and Haas Co., which is a polypropylene glycol dibenzoate.

EXAMPLES

Quantitative examples of the present invention are provided in Table 2. The thickness values depicted in the columns of Table 2 represent specified dimensions of the tapes found in the LTCC laminate. The dimensions found in the Table in no way limit the invention, but are represented embodiments for demonstration purposes. Note the dimensions in the Table are "green" measurements meaning unfired.

The examples were prepared according to the configuration (as defined above) of the various laminates (see dimensions A, B, C and D in Table 2). Three types of green tape used in this invention include the primary tape (101) (thickness not exceeding 20 mils and preferably 1 to 10 mils), the internal constraining tape (102) (thickness not exceeding 10 mils and preferably 1 to 3 mils), and the release tape (201) (thickness not exceeding 10 mils and preferably 1 to 5 mils). According to the defined configuration of the laminate, the selected tapes are blanked with corner registration holes into sheets of dimensions ranging from 3"×3" to 6"×6" or larger sizes. These green tape sheets are typically used as the dielectric or insulating material for multilayer electronic circuits. To connect various layers of the multilayer circuit, via holes are formed in the green tape. This is typically done by mechanical punching. However, a sharply focused laser can also be used to volatilize the organic substance and form via holes in the green tape. Typical via hole sizes range from 0.004" to 0.25". The interconnections between layers are formed by filling the via holes with a thick film conductive composition. This composition is usually applied by screen printing. Each layer of circuitry is completed by screen printing conductor tracks. Also, resistor compositions or high dielectric constant compositions can be printed on selected layer(s) to form resistive or capacitive circuit elements. Furthermore, specially formulated high dielectric constant green tapes similar to those used in the multilayer capacitor industry can be incorporated as part of the multilayer circuitry.

After each layer of the circuit is completed, the individual layers are collated and laminated. A confined uniaxial or isostatic pressing die is used to insure precise alignment between layers. Firing is carried out in a standard thick film conveyor belt furnace or in a box furnace with a programmed heating cycle. This method will, also, allow top or bottom conductors to be co-fired as part of the constrained sintered structure because the release tape is used only at the bottom or top layer of the asymmetrical laminate structure. A typical procedure of water washing, mechanical burnishing or sand blasting is used to remove the release tape and clean the resultant laminate after firing. The parts were then evaluated for any shrinkage and substrate camber.

As used herein, the term "firing" means heating the assemblage in an oxidizing atmosphere such as air to a temperature, and for a time sufficient to pyrolyze (burn-out) all of the organic material in the layers of the assemblage to sinter any glass, metal or dielectric material in the layers and thus densify the entire laminate.

It will be recognized by those skilled in the art that in each of the laminating steps the layers must be accurate in registration so that the vias are properly connected to the appropriate conductive path of the adjacent functional layer.

The term "functional layer" refers to the printed green tape, which has conductive, resistive or capacitive functionality. Thus, as indicated above, a typical green tape layer may have printed thereon one or more resistor circuits and/or capacitors as well as conductive circuits.

Example 5 in Table 2 describes a symmetrical configuration that demonstrates the flatness of structure that can be achieved after firing. The measured camber was less than 0.003 inches per one inch of diagonal substrate length. Example 6 in Table 2 represents an asymmetrical condition with no release tape present. The severe camber obtained (~0.010 inches per one inch of diagonal length) demonstrates the difficulty of successfully co-firing such structures.

All of the conditions using the bold large type produced flat parts with a camber of less than 0.003 inches per one inch of diagonal substrate length. Those in the smaller type produced camber in excess of this limit. Example 17 represents an asymmetrical configuration in which release tape was applied to both sides of the laminate. This is contrary to the teachings of this patent. The measured camber was greater than 0.015 inches per one inch of diagonal substrate length. This example serves to demonstrate the significance of the application of release tape to only one side of the laminate, namely the side that is opposite the layers of greatest asymmetry.

Tape compositions used in the examples were prepared by ball milling the fine inorganic powders and binders in a volatile solvent or mixtures thereof. To optimize the lamination, the ability to pattern circuits, the tape burnout properties and the fired microstructure development, the following volume % formulation of slip for constraint and primary tape was found to provide advantages. The formulation of typical slip compositions is also shown in weight percentage, as a practical reference. The inorganic phase is assumed to have a specific density of 4.5 g/cc for glass and 4.0 g/cc for alumina and the organic vehicle is assumed to have a specific density of 1.1 g/cc. The weight % composition changes accordingly when using glass and oxides other than alumina as the specific density maybe different than those assumed in this example.

Typical Primary and Internal Constraining Tape Compositions:

|  | Volume % | Weight % |
|---|---|---|
| Inorganic phase | 41.9 | 73.8 |
| Organic phase | 58.1 | 26.2 |

The above volume and weight % slip composition may vary 5 dependent on the desirable quantity of the organic solvent and/or solvent blend to obtain an effective slip milling and coating performance. More specifically, the composition for the slip must include sufficient solvent to lower the viscosity to less than 10,000 centipoise; typical viscosity ranges are 1,000 to 4,000 centipoise. An example of a slip composition is provided in Table 3. Depending on the chosen slip viscosity, higher viscosity slip prolongs the dispersion stability for a longer period of time (normally several weeks). A stable dispersion of tape constituents is usually preserved in the as-coated tape.

TABLE 3

| Primary and Internal constraining Tape Slip Compositions: | |
|---|---|
| Component | Weight % |
| Acrylate and methacrylate polymers | 4.6 |
| Phthalate type plasticizers | 1.1 |
| Ethyl acetate/isopropyl alcohol mixed solvent | 20.4 |
| Glass powder | 50.7 |
| Alumina powder | 23.2 |

The glasses used in the Examples were melted in Pt/Rh crucibles at 1450–1600° C. for about 1 hour in an electrically heated furnace. Glasses were quenched by metal roller as a preliminary step and then subjected to particle size reduction by milling. The glass particles were adjusted to a 5–7 micron mean size by milling prior to formulation as a slip. Since additional milling was utilized in the fabrication of slip, the final mean size is normally in the range of 1–3 microns.

The release layer was comprised of non-metallic particles dispersed in a solid organic polymer binder. An example of a slip composition for the release tape is given in Table 4.

TABLE 4

| Non-permanent Release Tape Slip Composition | |
|---|---|
| Component | Weight % |
| Acrylic binder | 6.8 |
| Phthalate type plasticizers | 2.0 |
| Ethyl acetate/isopropanol solvent | 28.7 |
| Alumina powder | 62.5 |

Example 1

A laminate was prepared using the following materials:

A low k primary tape, tape 1, as described above in Table 3 and with the glass powder containing 64 volume percent of a glass with the composition in weight percent of: $SiO_2$ 53.5, $Al_2O_3$ 13.0, $B_2O_3$ 8.5, CaO 17.0, MgO 1.0, $Na_2O$ 2.25, $Li_2O_3$ 0.25, $K_2O$ 1.50, SrO 3.00 and 36 volume percent $Al_2O_3$. The green thickness was 4.5 mils or 114 micrometers.

A high k internal constraining tape, tape 2, as described above in Table 3 and with glass powder containing 66.3% volume percent of a glass with the composition in weight percent of: $B_2O_3$ 11.84, BaO 21.12, $Li_2O$ 1.31, $P_2O_5$ 4.14, $TiO2$ 25.44, CsO 6.16, $Nd_2O_3$ 29.99, and 33.7 volume percent of $Al_2O_3$. The green thickness was 2.0 mils or 51 micrometers.

A non-permanent release tape, tape 3, as described in Table 4. The green tape thickness was 5.0 mils or 127 micrometers.

Ten sheets, 6 inches by 6 inches, were cut from a roll of tape 1. Two sheets, 6 inches by 6 inches, were cut from a roll of tape 2. One sheet, 6 inches by 6 inches, was cut from a roll of tape 3.

The sheets were then arranged as follows: 2 sheets of tape 1 totaling 229 micrometers were placed at the bottom of the stack. On top was placed two sheets of tape 2 totaling 102 micrometers. Then 8 sheets of tape 1 totaling thickness of 914 micrometers were placed next in sequence. A single sheet of release tape with a thickness of 127 micrometers was placed on top of this. The stack was laminated using a uniaxial press at 3000 psi at 70° C. for 5 minutes using one orientation and then 5 minutes using an orientation rotated 90°.

After lamination the parts were placed on setters and fired in a conveyer furnace with an air atmosphere where the temperature was increased from room temperature to 850° C. and held for 18 minutes and then allowed to cool back to room temperature the whole process taking approximately 3 hours and 30 minutes.

The part was then examined for camber by measuring the deflection of its center point using a dial gage. Camber is expressed as the deflection in inches of the center point of the substrate divided by the number of inches along one diagonal (length) of the substrate. The example part demonstrated less than 0.003 inches per one inch of diagonal substrate length and was judged acceptable. Under normal circumstances parts exhibiting less than 0.003 inches of camber per one inch of diagonal substrate length are judged acceptable.

Example 2

Example 1 was repeated using the same type tapes as described in Example 1 with sheets cut to 6 inches by 6 inches.

Ten sheets, 6 inches by 6 inches, were cut from a roll of tape 1. Five sheets, 6 inches by 6 inches, were cut from a roll of tape 2. One sheet, six inches by six inches, was cut from a roll of tape 3.

The sheets were then arranged as follows: 2 sheets of tape 1 to a total of 229 micrometers were placed at the bottom of the stack. On top of this was placed five sheets of tape 2 to a total of 254 micrometers. Then 8 sheets of tape 1 to a total thickness of 914 micrometers were placed next in sequence. Finally the single sheet of release tape to a thickness of 127 micrometers was placed on top of this. The whole was collated and then laminated using a uniaxial press at 3000 psi at 70° C. for 5 minutes using one orientation and then an additional 5 minutes using an orientation rotated 90° from the previous one.

After lamination the parts were placed on setters and fired in a conveyer furnace in an air atmosphere where the temperature was increased from room temperature to 850° C. and held for 18 minutes and then allowed to cool back to room temperature the whole process taking approximately 3 hours and 30 minutes.

The part was then examined for camber by measuring the deflection of its center point using a dial gage. Camber is expressed as the deflection in inches of the center point of the substrate divided by the number of inches along one diagonal (length) of the substrate. Normally parts exhibiting less than 0.003 inches of camber per inch of diagonal substrate length are judged acceptable. The example part demonstrated approximately 0.005 inches per one inch of diagonal substrate length and was judged unacceptable.

Example 3

Example 1 was repeated using the same type tapes, but with the different sized sheets of 3 inches by 3 inches.

Six sheets, 3 inches by 3 inches, were cut from a roll of tape 1. Three sheets, 3 inches by 3 inches, were cut from a roll of tape 2. One sheet, 3 inches by 3 inches, was cut from a roll of tape 3.

The sheets were then arranged as follows: 1 sheet of tape 1 to a total of 114 micrometers was placed at the bottom of the stack. On top of this was placed three sheets of tape two to a total of 154 micrometers. Then 5 sheets of tape 1 to a total thickness of 572 micrometers were placed next in sequence. Finally the single sheet of release tape to a thickness of 127 micrometers was placed on top of this. The whole was collated and then laminated using a uniaxial press at 3000 psi at 70° C. for 5 minutes using one orientation and then an additional 5 minutes using an orientation that is rotated 90° from the previous one.

After lamination the parts were placed on setters and fired in a conveyer furnace in an air atmosphere where the temperature was increased from room temperature to 850° C. and held for 18 minutes and then allowed to cool back to room temperature the whole process taking approximately 3 hours and 30 minutes.

The part was then examined for camber by measuring the deflection of its center point using a dial gage. Camber is expressed as the deflection in inches of the center point of a substrate divided by the number of inches along one diagonal (length) of the substrate. The example part demonstrated less than 0.003" per one inch of diagonal substrate length and was judged acceptable. Normally parts exhibiting less than 0.003 inches of camber per one inch of diagonal substrate length are judged acceptable.

Example 4

Example 1 was repeated using the same type tapes, but with the different sized sheets of 3 inches by 3 inches.

Twelve sheets, 3 inches by 3 inches, were cut from a roll of tape 1. Two sheets, 3 inches by 3 inches, were cut from a roll of tape 2. One sheet, six inches by six inches, was cut from a roll of tape 3.

The sheets were then arranged as follows: 2 sheets of tape 1 to a total of 229 micrometers were placed at the bottom of the stack. On top of this was placed two sheets of tape 2 to a total of 102 micrometers. Then 10 sheets of tape 1 to a total thickness of 1143 micrometers were placed next in sequence. Finally the single sheet of release tape to a thickness of 127 micrometers was placed on top of this. The whole was collated and then laminated using a uniaxial press at 3000 psi at 70° C. for 5 minutes using one orientation and then an additional 5 minutes using an orientation rotated 90° from the previous one.

After lamination the parts were placed on setters and fired in a conveyer furnace with an air atmosphere where the temperature was increased from room temperature to 850° C. and held for 18 minutes and then allowed to cool back to room temperature the whole process taking approximately 3 hours and 30 minutes.

The part was then examined for camber by measuring the deflection of its center point using a dial gage. Camber is expressed as the deflection in inches of the center point of the substrate divided by the number of inches along one diagonal (length) of the substrate. The example part demonstrated approximately 0.005" per one inch of diagonal substrate length and was judged unacceptable. Normally parts exhibiting less than 0.003" of camber per one inch of diagonal substrate length are judged acceptable.

Examples 5 to 17

Examples 5–17 were prepared in a like manner as described in Examples 1–4. These examples utilized additional combinations of tapes 1, 2 and 3 (in various thicknesses) and the resultant values of camber, acceptable or unacceptable, are summarized in Table 2.

TABLE 2

|  | Laminate size | A (μm) Total thickness of low k tape (101) on side1 (green) | B (μm) Total thickness of high k tape (102) side 1to2 (green) | C (μm) Total thickness of low k tape (101) on side2 (green) | D (μm) Total thickness of release tape (201) side 2 (green) | Shrinkage (%) X, Y (fired) | Camber (inch) Deflection per inch of substrate diagonal length (fired) |
|---|---|---|---|---|---|---|---|
| Example 1 | 6" * 6" | 229 | 102 | 914 | 127 | −0.017 | <0.003 |
| Example 2 | 6" * 6" | 229 | 254 | 914 | 127 | −0.120 | ~0.005 |
| Example 3 | 3" * 3" | 114 | 152 | 572 | 127 | −0.119 | <0.003 |
| Example 4 | 3" * 3" | 229 | 102 | 1143 | 127 | −0.027 | ~0.005 |

TABLE 2-continued

| | Laminate size | A (μm) Total thickness of low k tape (101) on side1 (green) | B (μm) Total thickness of high k tape (102) side 1to2 (green) | C (μm) Total thickness of low k tape (101) on side2 (green) | D (μm) Total thickness of release tape (201) side 2 (green) | Shrinkage (%) X, Y (fired) | Camber (inch) Deflection per inch of substrate diagonal length (fired) |
|---|---|---|---|---|---|---|---|
| Example 5 | 6" * 6" | 572 | 102 | 572 | 0 | −0.050 | <0.003 |
| Example 6 | 3" * 3" | 114 | 102 | 572 | 0 | ND | ~0.010 |
| Example 7 | 3" * 3" | 0 | 102 | 457 | 127 | −0.047 | <0.003 |
| Example 8 | 3" * 3" | 114 | 25 | 229 | 127 | ND | <0.003 |
| Example 9 | 3" * 3" | 114 | 51 | 343 | 127 | −0.048 | <0.003 |
| Example 10 | 3" * 3" | 229 | 51 | 457 | 127 | −0.028 | <0.003 |
| Example 11 | 3" * 3" | 229 | 51 | 572 | 127 | −0.015 | <0.003 |
| Example 12 | 3" * 3" | 229 | 178 | 914 | 127 | −0.092 | <0.003 |
| Example 13 | 3" * 3" | 229 | 102 | 1715 | 127 | −0.030 | ~0.010 |
| Example 14 | 3" * 3" | 229 | 152 | 914 | 127 | −0.046 | ~0.010 |
| Example 15 | 3" * 3" | 229 | 152 | 914 | 254 | −0.079 | <0.003 |
| Example 16 | 6" * 6" | 229 | 254 | 914 | 254 | −0.151 | <0.003 |
| Example 17 | 6" * 6" | 114 | 51 | 457 | 127 side1 127 side2 | ND | >0.015 |

What is claimed is:

1. A method to produce a distortion-free asymmetrical low-temperature co-fired ceramic structure comprising at least one layer of glass-containing internal constraining tape and at least one layer of glass-containing primary tape wherein the internal constraining tape and the primary tape are laminated to form an asymmetrical laminate and wherein a release layer is deposited on at least one surface of the laminate forming an assembly, wherein the surface is opposite the position of greatest asymmetry of the laminated layers and wherein the assembly is thermally processed and the glass of the constraining tape initiates sintering before the glass of the primary tape thus producing a structure exhibiting an interactive suppression of x,y shrinkage.

2. The method of claim 1, in which the tape layers are metallized in a planar and in an interconnection manner.

3. The method of claim 1 wherein the assembly is populated with surface mount components.

4. The method of claim 1 wherein said primary tape has a dielectric constant in the range of 6 to 10 and said internal constraining tape has a dielectric constant in the range of 10 to 5000.

5. The method of claim 1 wherein the internal constraining tape comprises filler particles having a bimodal particle size distribution with D50 of the larger size particles being in the range of 1.5 to 2.0 microns and D50 of the smaller size particles being in the range of 0.3 to 0.8 microns.

6. The method of claim 1 wherein the primary tape comprises filler particles having a bimodal particle size distribution with D50 of the larger size particles being in the range of 1.5 to 2.0 microns and D50 of the smaller size particles being in the range of 0.3 to 0.8 microns.

7. The method of claim 1 wherein the glass of the primary tape comprises, based on total composition: $SiO_2$ 52–54, $Al_2O_3$ 12.5–14.5, $B_2O_3$ 8–9, CaO 16–18, MgO 0.5–5, $Na_2O$ 1.7–2.5, $Li_2O$ 0.2–0.3, SrO 0–4, $K_2O$ 1–2 in weight %.

8. The method of claim 1 wherein the glass of the constraining tape comprises, based on total composition: $B_2O_3$ 6–13, BaO 20–22, $Li_2O$ 0.5–1.5, $P_2O_5$ 3.5–4.5, $TiO_2$ 25–33, $Cs_2O$ 1–6.5, $Nd_2O_3$ 29–32 in weight %.

9. The method of claim 1 wherein the glass of the constraining tape comprises, based on total composition: $SiO_2$ 12–14, $ZrO_2$ 3–6, $B_2O_3$ 20–27, BaO 12–15, MgO 33–36, $Li_2O$ 1–3, $P_2O_5$ 3–8, $Cs_2O$ 0–2 weight %.

10. The method of claim 1 wherein the glass in the primary tape exhibits a dimensional change measured in TMA of about 700° C. or higher.

11. The method of claim 1 wherein the glass in the constraining tape exhibits a dimensional change measured in TMA of at least 75° C. lower than the primary tape.

* * * * *